United States Patent
Lin et al.

(10) Patent No.: US 7,225,385 B2
(45) Date of Patent: May 29, 2007

(54) OPTICAL RECORDING METHOD

(75) Inventors: Kun-Long Lin, Taipei (TW);
Wen-Jeng Chang, Taipei (TW);
Chih-Yung Chen, Taipei (TW);
Chiung-Ying Peng, Taipei (TW)

(73) Assignee: Via Technologies, Inc., Taipei (TW)

( * ) Notice: Subject to any disclaimer, the term of this patent is extended or adjusted under 35 U.S.C. 154(b) by 478 days.

(21) Appl. No.: 10/780,563

(22) Filed: Feb. 19, 2004

(65) Prior Publication Data
US 2004/0163026 A1 Aug. 19, 2004

Related U.S. Application Data

(60) Provisional application No. 60/447,700, filed on Feb. 19, 2003.

(51) Int. Cl.
*H03M 13/29* (2006.01)
*H04K 1/04* (2006.01)

(52) U.S. Cl. .......................... 714/755; 380/216
(58) Field of Classification Search ................. 714/755; 380/216
See application file for complete search history.

(56) References Cited

U.S. PATENT DOCUMENTS

| | | | |
|---|---|---|---|
| 5,815,472 A | | 9/1998 | Kuroda et al. |
| 5,987,630 A | * | 11/1999 | Yamawaki .................. 714/701 |
| 6,005,839 A | * | 12/1999 | Sako et al. ............... 369/275.3 |
| 6,301,208 B1 | * | 10/2001 | Sugaya et al. ........... 369/275.3 |
| 6,373,800 B1 | * | 4/2002 | Takahashi ................ 369/53.15 |
| 6,704,259 B2 | * | 3/2004 | Kashihara et al. ........ 369/47.27 |
| 6,931,586 B1 | * | 8/2005 | Shim et al. .................. 714/800 |
| 2002/0027859 A1 | * | 3/2002 | Kawamae et al. ........ 369/59.25 |

* cited by examiner

*Primary Examiner*—Stephen M. Baker
(74) *Attorney, Agent, or Firm*—Rabin & Berdo, P.C.

(57) ABSTRACT

A scrambling method for generating recording data onto a disc includes vertically scrambling main data, which is stored in DRAM, to generate PO, wherein the scrambled data due to generate PO is not stored in DRAM; then scrambling data again to generate PI; the scrambled data due to generating PI adds with ID, IED, RSV, EDC, PI, and PO, arranging in orders and recording onto a disc.

27 Claims, 9 Drawing Sheets

OPTICAL RECORDING METHOD

REFERENCE TO PROVISIONAL APPLICATION

This application claims priority under 35 USC §119 (e) of applicants' copending provisional application Ser. No. 60/447,700, filed Feb. 19, 2003.

BACKGROUND OF THE INVENTION

1. Field of the Invention

The present invention relates in general to an optical recording method. In particular, the present invention relates to a method for recording data onto optical discs.

2. Description of the Related Art

Formatting of data onto optical discs and error correcting process thereof are explained in FIGS. 1 and 2. The error correcting process for the DVD and an ECC block are firstly explained in FIGS. 1A and 1B.

As shown in FIG. 1A, information recorded to the DVD has a physical structure including a plurality of data sectors 20. One data sector 20 comprises, in order from the head position thereof, Identification Data (ID) 21 of a start position of the data sector 20, ID Error Detection code (IED) 22 correcting errors in ID 21, reserve data (RSV) 23, main data 24, the constituent data to be recorded, and an Error Detection Code (EDC) 25 for detecting errors in ID 21, IED 22, RSV 23, and main data 24. A plurality of data sectors arrange in sequence and constitute recording data.

Next, a process in an encoder, described subsequently, for creating an ECC block 30 by a plurality data sectors is explained in FIG. 1B. As shown, an EGG block is formed by 16 data sectors is explained in FIG. 1B. To forming the EGG format, each data sector 20 including ID 21, IED 22, RSV 23, main data 24, and EDC, each data sector having 2064 bytes arranged in an array of 12 data rows each containing 172 bytes. The first data row should start with three fields: ID, IED, and RSV, followed by 160 bytes main data. The next 10 data rows should each contain 172 bytes main data, and the last data row should contain 168 bytes main data followed by 4 bytes EDC.

For each data row, an ECC inner-code Parity (PI) 31 having 10 bytes is generated and attached to the end of the each corresponding data row to constitute one correction block 34 as shown on the right side of FIG. 1B. At this stage, correction blocks 34 with PI 31 attached are arranged in 12 lines along with the y-axis orientation. After that, the process is repeated with respect to 16 data sectors (for an ECC block). Accordingly, correction blocks 34 of 192 (=12×16) lines are obtained.

Next, 16 ECC outer-code parity (PO) 32 is respectively generated and attached to each corresponding data columns. It is noted that PO 32 also attaches to a portion of PI 31 within the correction block 34.

From the above mentioned process, one ECC block 30 including 16 data sectors is produced as shown in FIG. 1B (the right side). At this time, the total amount of the information included within one ECC block 30 is expressed by:

(172+10)bytes×(192+16)lines=37856 bytes

The main data 24 (i.e., other than parity codes and data information) in it is expressed by:

2048 bytes×16=32768 bytes

An ECC block 30 shown in FIG. 1B is formed by arranging 16 data sectors in an array of 192 rows of 172 bytes each. To each of the 192 rows 10 bytes of PI are added, then, to each resulting 182 columns, 16 bytes PO are added. Thus a complete ECC block has 208 rows of 208 bytes each. The bytes of this array are identified as $B_{i,j}$ as shown in FIG. 1B, where I is the row number and j is the column number. For example, $B_{1,0}$ indicates the first line and column zero, and $B_{190,170}$ indicates the line 190 and column 170. Thus, $B_{i,j}$ for i=0 to 207 and j=172 to 181 are bytes of PI 31; $B_{i,j}$ for i=192 to 207 and j=0 to 171 are bytes of PO 32. Correction blocks 34 are consecutively recorded to the optical disc.

ECC block 30 comprises both PI 31 and PO 32, as shown in the right side of FIG. 1B, in order that data arranged along an x-axis orientation in FIG. 1B can be corrected by PI 31 and the data arranged along the y-axis orientation by PO 32. It is thus possible to perform error correction along both axes within the ECC block 30 shown in FIG. 1B.

More concretely, for example, if a certain correction block 34, as mentioned above, consecutively recorded to a disc, each having 182 bytes in total including PI 31, is entirely destroyed by physical damage to the disc, merely the one-byte data is lost with respect to PO 32 in one column, as viewed along the y-axis orientation. Thus, by carrying out error correction using PO 32 at each column, it is possible to accurately reproduce original information from the damaged location, even though one correction block 34 may be entirely destroyed.

The manner of actually recording a data sector included in the ECC block 30 shown in FIG. 1B is explained in FIG. 2. In FIG. 2, the bytes indicated as $B_{i,j}$ corresponds to the data shown on the right side of FIG. 1B. Processes at the time of recording the data sector 20 in FIG. 2 (i.e. an interleave process and an 8-to-16 modulation process) are performed by the encoder, described subsequently.

When recording the ECC block 30 to the disc, the plurality of data rows of the ECC block 30 are firstly aligned along the x-axis orientation for each correction block 34, as shown in a top stage of FIG. 2, and are then are interleaved for division into 16 recording sectors 40 (as shown in a second top stage of FIG. 2). At this time, one recording sector 40 includes 2366 bytes (=37856 bytes/16), with a data sector 20, PI 31 and PO 32 intermingled and included in each recording sector 40. However, ID 21 (refer to FIG. 1A) in the data sector 20 positions a head portion of each recording sector 40.

The recording sector 40 is divided into a plurality of segments 41 each comprising data and having 91 bytes, with a header H appended to each (as shown in a third top stage of FIG. 2). Then, one sync frame 42 is produced from one segment 41 by 8-to-16 modulating the recording sector 40 including the paired headers H and segments 41. At this time, one sync frame 42 is composed of a header H' and segment 43 (as shown in a bottom stage of FIG. 2). Further, data size in one sync frame 42 is expressed by:

91 bytes×8×(16/8)=1456 bytes

Then, data is written to a disc in continuous sync frames 42. At this time, one recording sector 40 includes 26 sync frames 42.

Using the disclosed physical format and recording to the disc, the 8-to-16 demodulation and de-interleaving (refer to FIG. 2) are performed when reproducing the data to thereby reproduce the original ECC block 30 while performing the effective error correction to accurately reproduce the data.

As shown in FIG. 3, U.S. Pat. No. 5,815,472 discloses an information recording apparatus that records to a DVD-R as explained previously. The following assumptions are made in the embodiment described; pre-pits or the like are formed in advance on the information tracks, to which data will be recorded. Then, at the time of recording, address information of the disc 1 is obtained by detecting the pre-pits. Thus, a record position for the disc is detected. The conventional information recording apparatus S comprises a pick-up 2, a reproduction amplifier (AMP) 3, a decoder 4, a pre-pit signal decoder 5, a spindle motor 6, a servo circuit 7, a processor (CPU) 8, an encoder 9, a power control circuit 11, a laser drive circuit 12, and an interface 13, such as an IDE bus. A data record signal $S_R$ is input through the interface 13 from an external host computer 14 to the recording apparatus S. In addition, the encoder 9 is provided with a DRAM 10.

FIG. 4 is a flowchart showing conventional DVD disc encoding. First, main data is read from the host computer 14 through the interface (IDE Bus) 13 shown in FIG. 3 and written to the DRAM 10 (S1). Next, main data restored in the DRAM 10 is read (S2). Next, the 2-byte ID Error Detection code (IED) is generated to correct errors in the 4-byte ID information (S3). Next, 6 bytes of reserve data (RSV) denoting copyright is generated (S4). Next, 4 bytes of error detection code (EDC) is generated for detecting errors (S5). Next, the data including main data. ID, EC. RSV. and EDC is scrambled (S6). Thus, a data sector is obtained. Next, 10 bytes PI is generated according to the scrambled data, and is attached to the 16 data sectors are (S7). Next, the scrambled data, ID, IED, RSV, EDC and P1 are stored to the DRAM (S8). The data stored in the DRAM is read again to generate 16 bytes PO and interleave the data sectors and PO (S9). Next, the 16 data sectors interleaving the 16 bytes PO are stored in the DRAM (S10). Thus, the data stored in the DRAM is read to be written to the disc (S11).

However, in steps S1, S2, S8, S9, S10 and S11, much data is transmitted between the optical drive IC and the memory buffer (DRAM). After reading main data from the host computer, main data (33024 (172×192) bytes) are written to DRAM (Step S1). Next, the main data (33024 bytes) is read from the DRAM (Step S2) to generate PI (1920 (10×192) bytes). Next, the main data (33024 bytes) and PI (1920 bytes) are written to the DRAM (Step S8). Next, the main data (33024 bytes) and PI (1920 bytes) are read from the DRAM to generate PO of the main data (2752 (172×16) bytes) and of the PI (160 (10×16) bytes) (Step S9). The PO (2912 (2752+160) bytes) is then written to the DRAM (Step S10), and the total data (37856 (33024+1920+2752+160) bytes) stored in the DRAM are read out for recording to the disc (S11). Therefore, a total of 176704 bytes are accessed between the drive IC and the DRAM.

Also, it is noticed that in order to generate PI (in step S7 and PO (in step S9), main data must be scrambled in advance (in step S6), the scrambled data would be stored in DRAM; as a result if there is a block that needs the same main data to record on to the same disc, thus the scrambled data in DRAM should be read out and descrambled to the original main data and then scrambled again due to the ID information being changed.

Thus, the recording speed of the optical disc is limited by the bandwidth of the memory buffer. The recording speed of the optical disc can be increased by increasing the clock rate of the memory bus, however, this increases power consumption.

SUMMARY OF THE INVENTION

The present invention provides a method for generating recording data, including vertically scrambling main data stored in DRAM to generate PO, wherein the generated scrambled main data is not stored back into DRAM and the main data in DRAM remains the same; scrambling the main data again to generate PI; and delivering the scrambled data accompanied with ID, IED, RSV, EDC, PI, and PO in proper sequence for recording onto a disc.

As per the description above, because the scrambled data used for generating PO is not written over the main data stored in DRAM, as a result, the main data stored in DRAM remains unchanged.

BRIEF DESCRIPTION OF THE DRAWINGS

The present invention will become more fully understood from the detailed description given hereinbelow and the accompanying drawings, given by way of illustration only and thus not intended to be limitative of the present invention.

Figure 5:
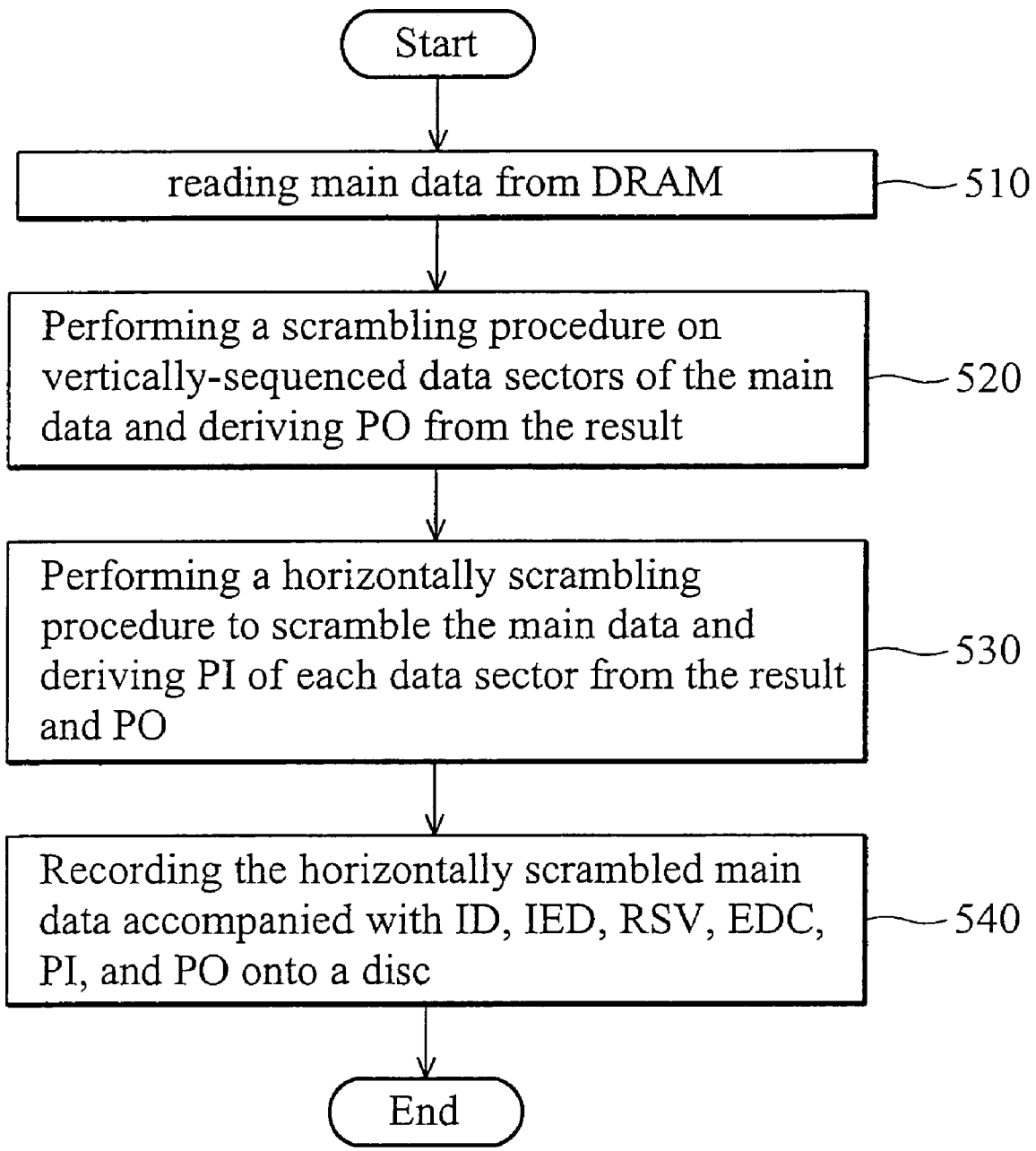
FIG. 5 is a flowchart showing a scrambling method for generating recording data of the present invention.

Please refer to FIG. 5, which shows an operating flow illustrative of the process of the scramble method for generating recording data according to the present invention. Firstly, the main data of a block stored in DRAM is accessed in step 510 for performing a scrambling procedure on vertically-sequenced data sectors of the main data and deriving an ECC outer-code parity (i.e. PO) from the result (step 520). The scrambled data used for generating PO is not stored back into DRAM (i.e. data in the DRAM is not scrambled data). That is to say the main data in DRAM still remains unchanged. Next, a horizontally scrambling procedure is then activated to scramble the main data again, and to derive inner-code parity (i.e. PI) of each data sector from the result and outer-code parity (step 530). Then, the scrambled data accompanied with ID, IED, RSV, EDC, PI, and PO are arranged in proper sequence and ready to be recorded onto a disc in step 540.

Figure 1A:
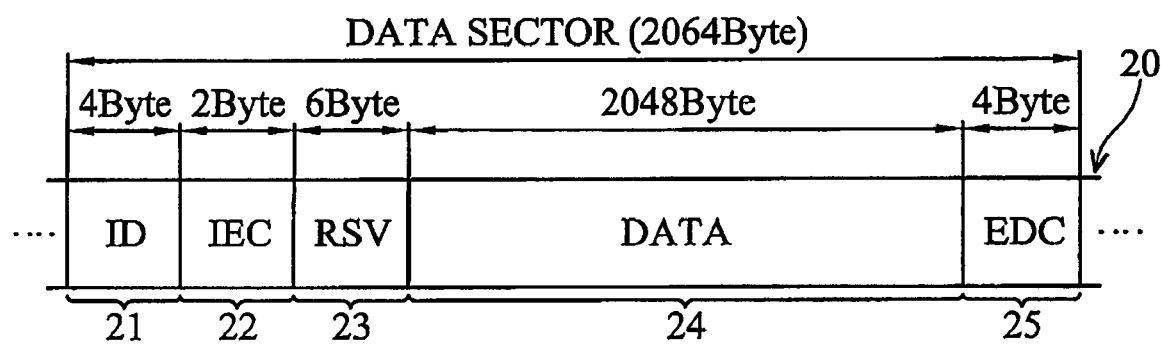
FIG. 1A shows a data structure of recording data.
Figure 1B:
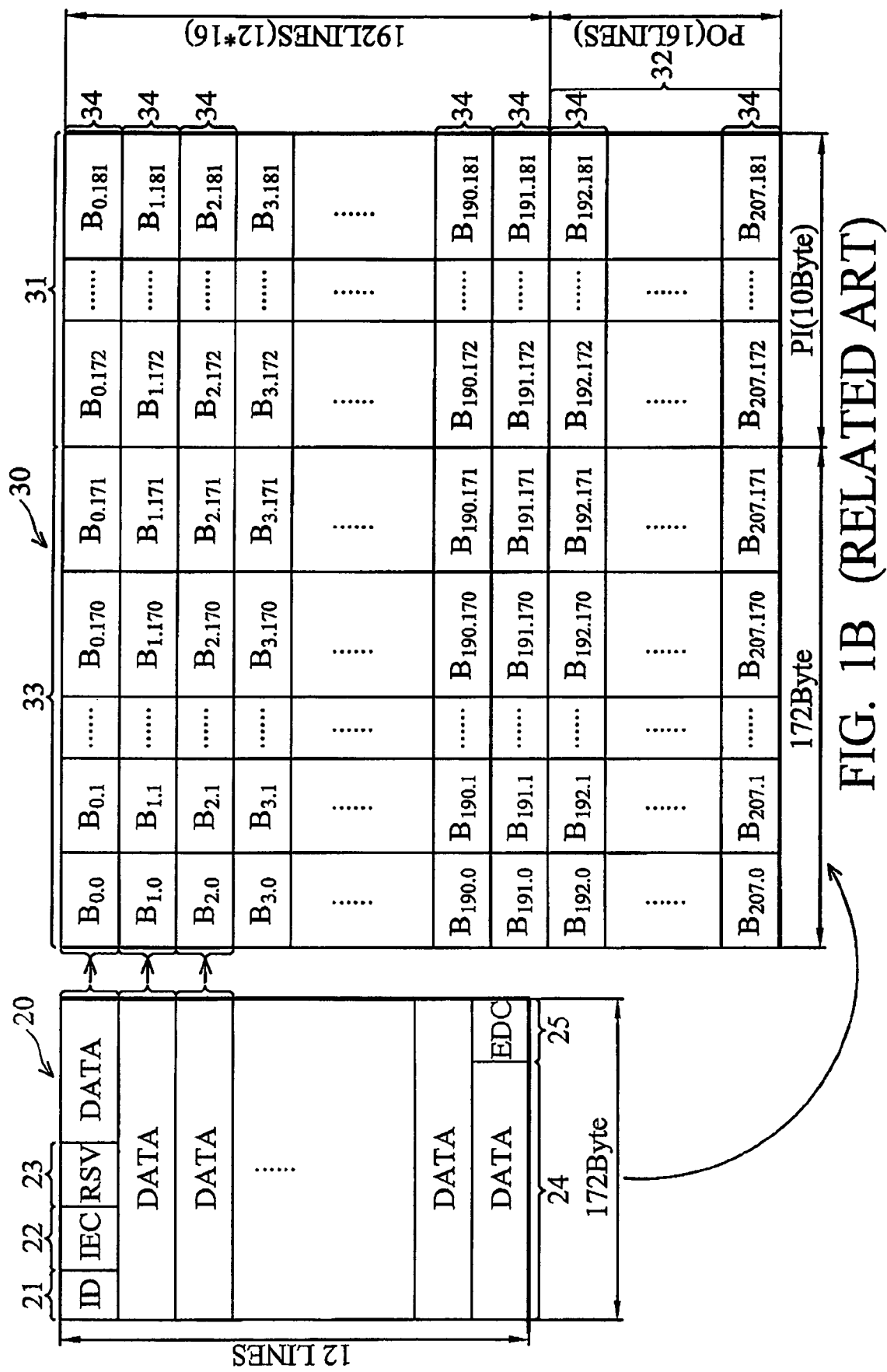
FIG. 1B shows a configuration of an ECC block in the recording data.
Figure 2:
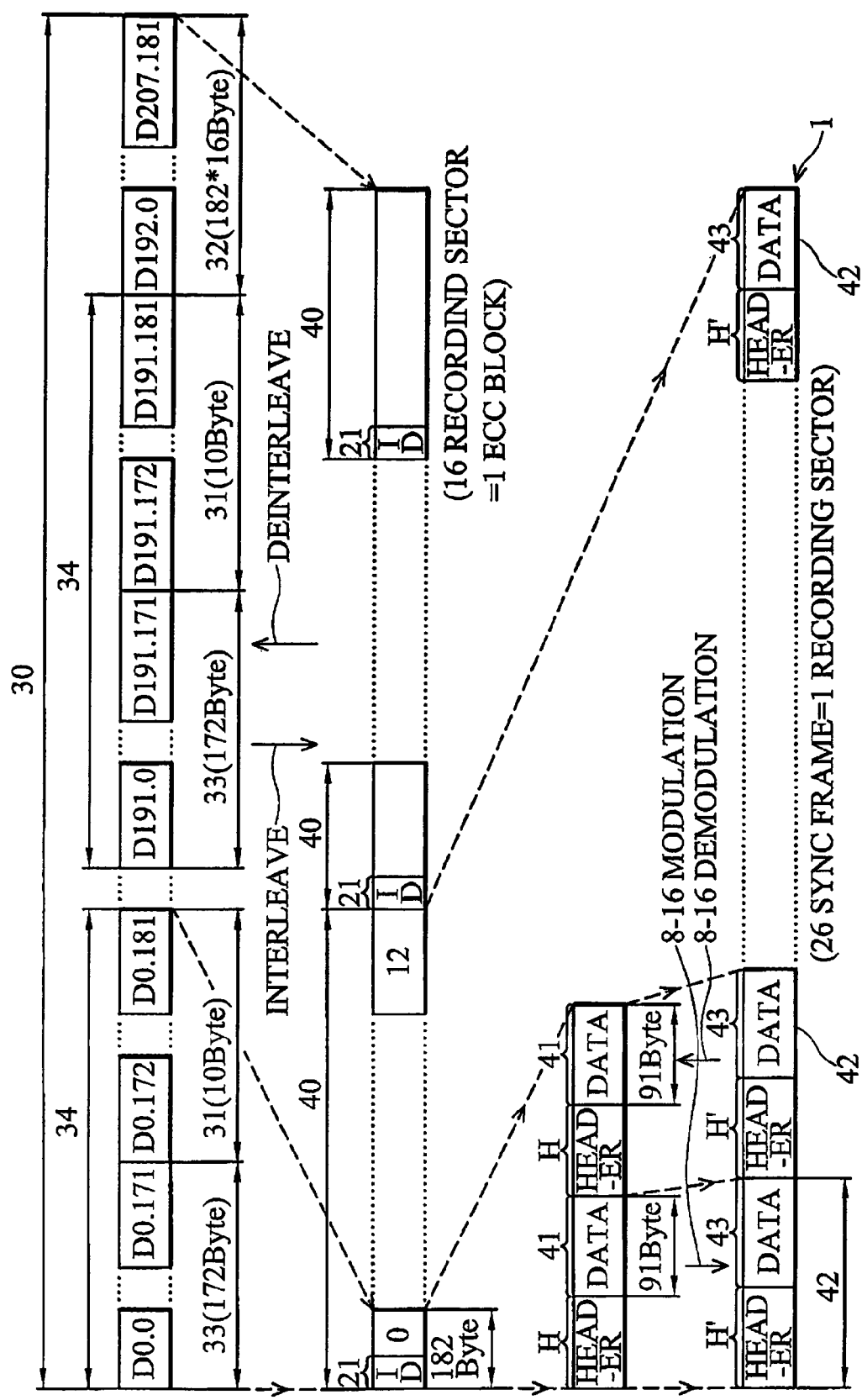
FIG. 2 shows a physical format of recording data.
Figure 3:
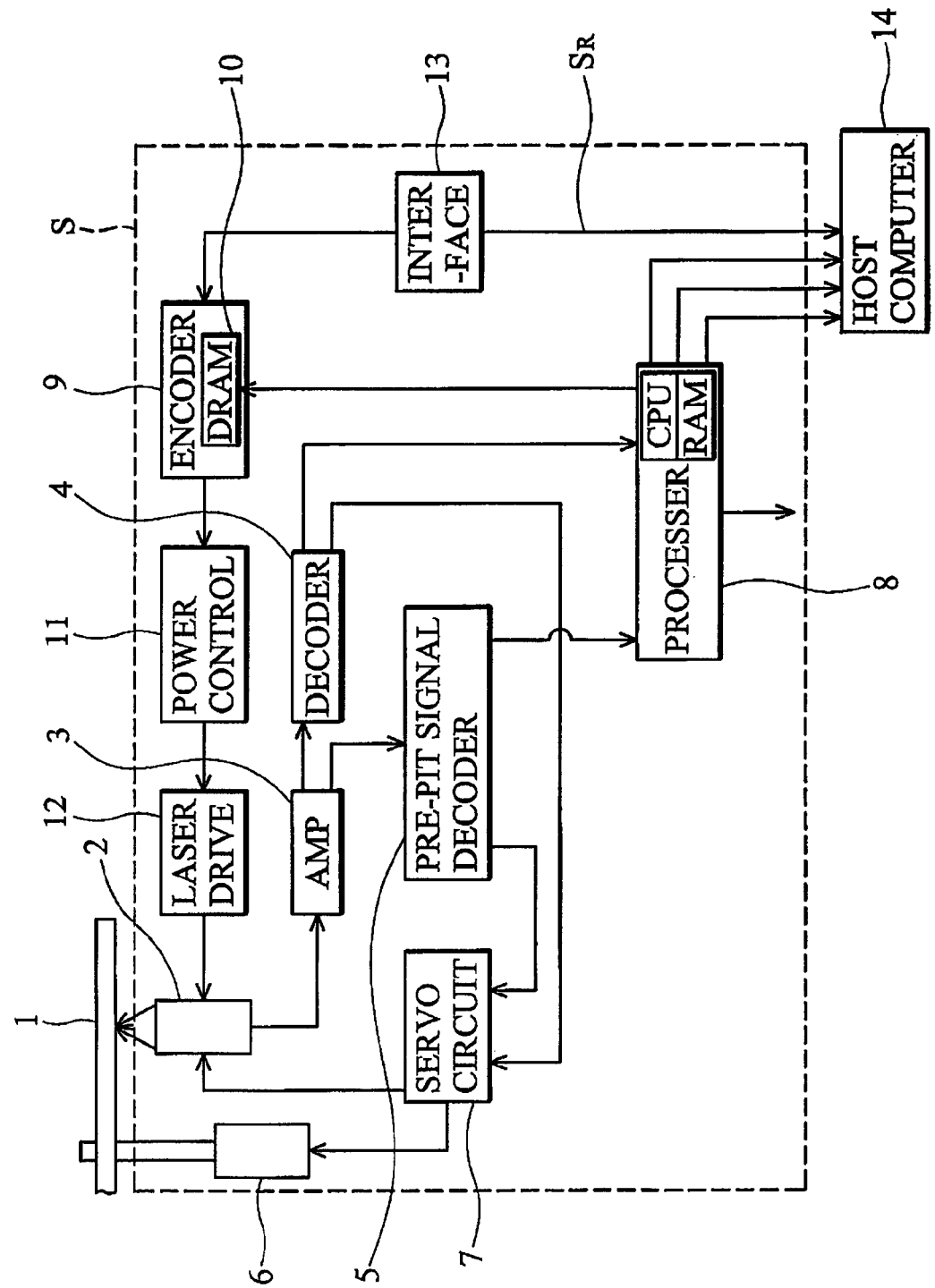
FIG. 3 is a block diagram showing a schematic configuration of an information recording apparatus.
Figure 4:
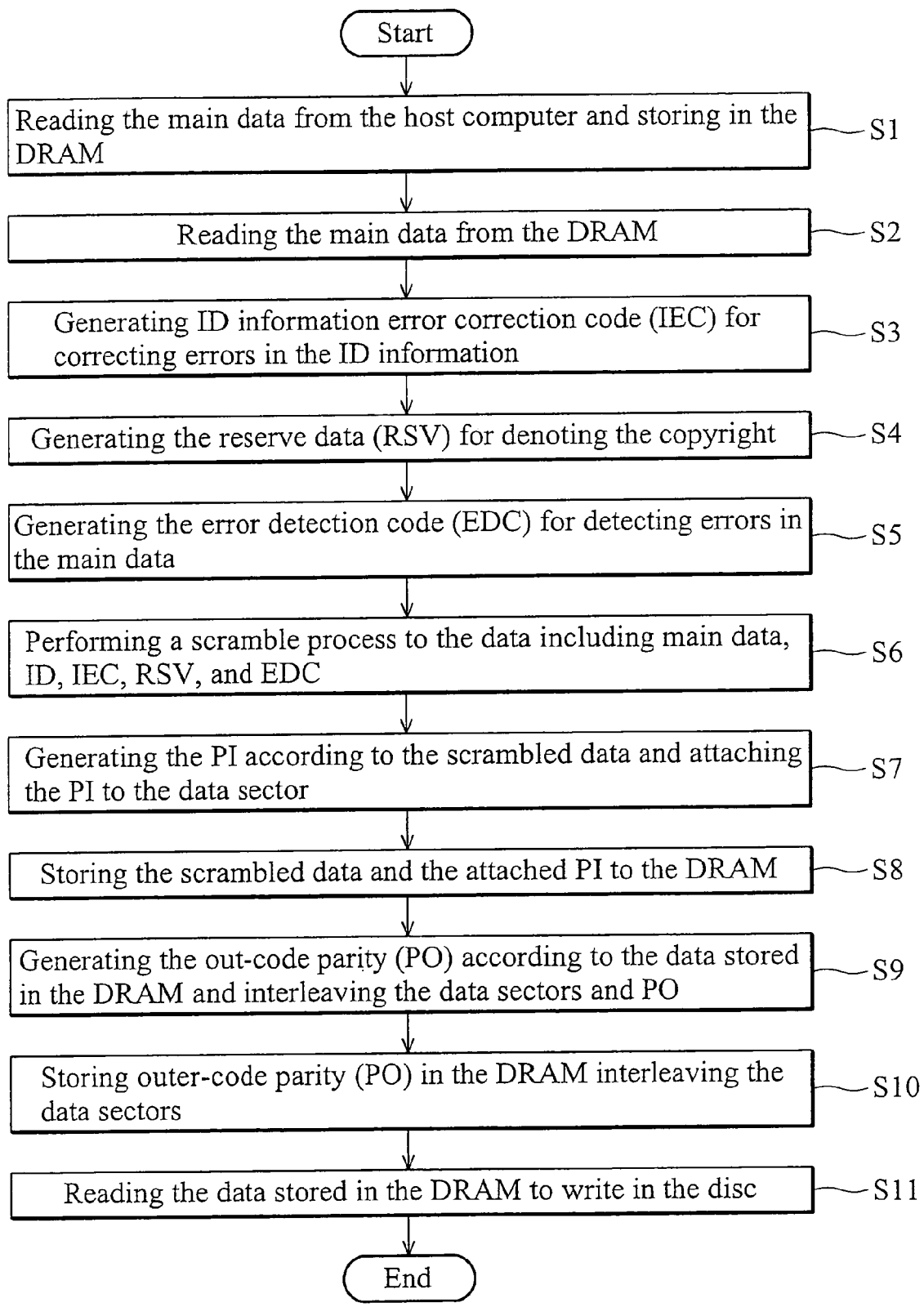
FIG. 4 is a flowchart showing a conventional DVD encoding process.

More detail description about the disclosed method for generating recording data is shown as follows. First, when main data is read from the host computer 14 through the interface (IDE Bus) 13 shown in FIG. 3, a 2-byte IED is generated for achieving the purpose of error correction for the 4-byte ID information. Next, 6 bytes RSV denoting copyright is generated, while, 4 bytes EDC are finally generated Thus completes an establishing process for a data sector. Therefore, 16 data sectors are written to the DRAM to form an ECC block (i.e. 16 data sectors are used to establish one ECC block).

Figure 6A:
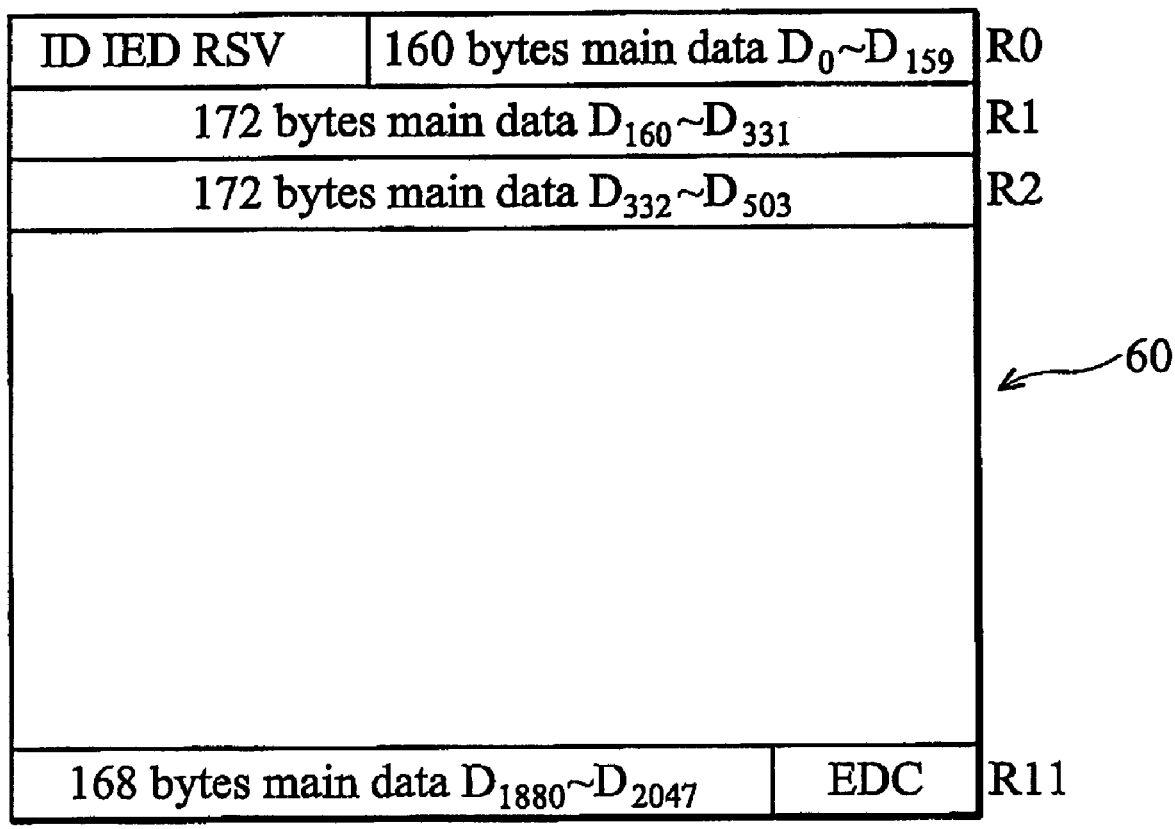
FIG. 6A shows a data sector for explaining performing scrambling in the invention.

FIG. 6A shows a configuration of a data sector 60 having 2064 bytes arranged in an array of 12 rows each containing 172 bytes. The first row R0 should start with three fields: ID, IED, and RSV, followed by 160 bytes main data. The next 10 rows R1~R10 should each contains 172 bytes main data, and the last row R11 should contain 168 bytes main data followed by 4 bytes EDC. The 2048 bytes main data are identified as $D_0$~$D_{2047}$. Data accessed from the DRAM is written into 12 rows in sequence and vertically scrambled to generate PO. Please note that the generated PO is stored into the DRAM, however, the scrambled data for generating PO is not stored into DRAM, which indicates that the main data remains unchangeable in DRAM. Next, the data including the just stored PO are read from the DRAM and scrambled to generate PI. Finally, after generated PI is attached to corresponding data row and PO, the scrambled data due to generating PI with ID, IED, RSV, PI, and PO are sequentially recorded onto the disc. Here, data being actually recorded that include 16 data sectors and PO of each data sectors are respectively generated according to corresponding scrambled data, then interleaving generated PO to attachéPO to the corresponding data sector.

A scrambling formula is provided to perform scrambling:

$$D'_K = D_K \oplus S_K \text{ (for } K=0 \text{ to } 2047\text{);}$$

where $D'_K$ are scrambled data bytes; $D_K$ are main data bytes; $S_K$ are scrambling bytes with respect to the corresponding $D_K$; $\oplus$ stands for Exclusive OR operation.

Figure 6B:
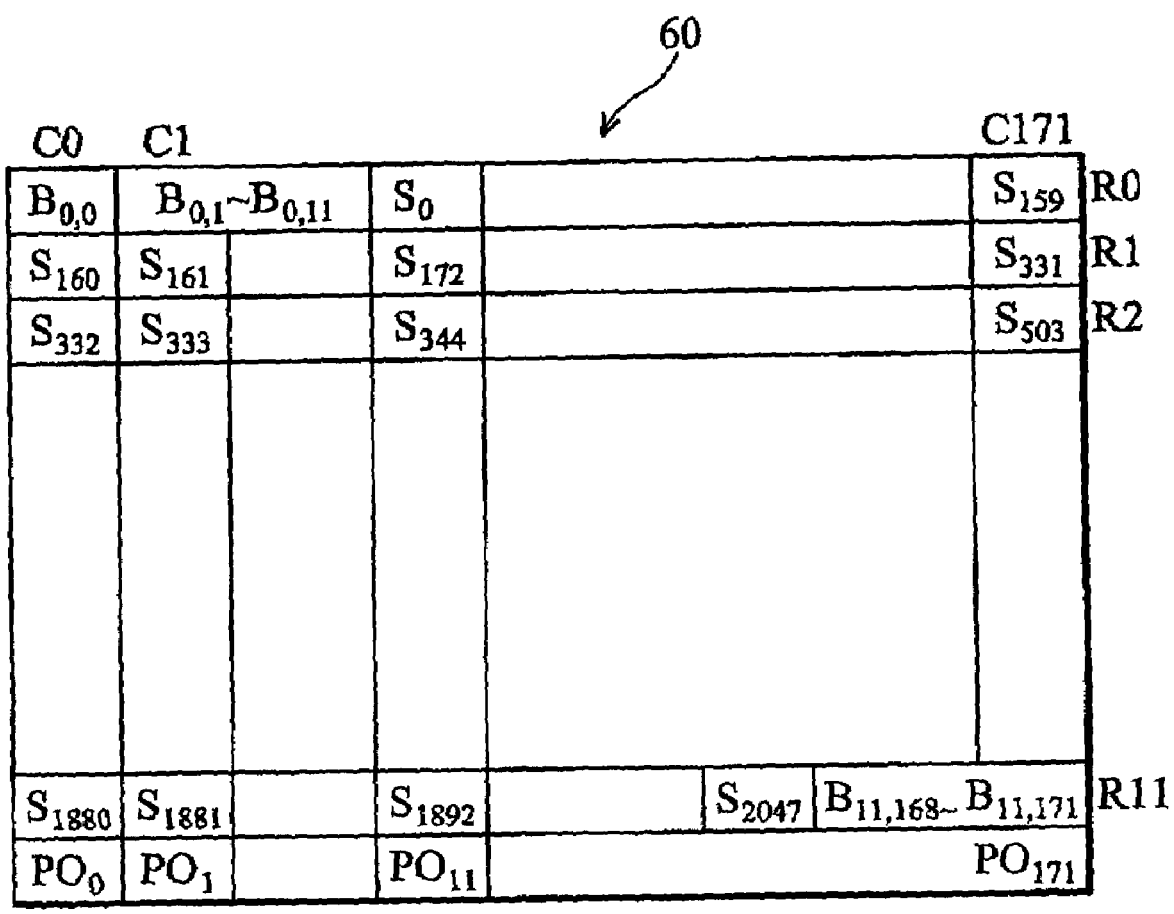
FIG. 6B shows a data sector for explaining performing vertically scrambling in the invention.

It is noted that in the present invention, generating PO is superior to generating PI; as a result PO is derived from vertically scrambling. There are two ways in the invention to derive each scrambling bytes $S_0$~$S_{2047}$ (i.e. $S_0$ is an initial value) (as shown in FIG. 6B) of the 2048 bytes main data in each column C0~C171 of the data sector 60 to perform "vertically scrambling". One conventional way is after deriving the initial value $S_0$, then by using the initial value $S_0$, each scrambling bytes $S_1$ to $S_{2047}$ could be figured out in sequence (i.e. by using $S_0$ then $S_1$ could be figured out and then other scrambling bytes could also be figured out in sequence). Another way is providing a calculation mechanism which could help to vertically figure out seed values (i.e. by using the calculation mechanism with known $S_0$, then $S_{172}$ could be figured out and then other seed values could also be figured out in orders).

For example $PO_0$ of the first column C0 of data sector 60 is generated by vertically scrambling main data $D_{160}$ to $D_{1880}$, thus $S_{160}$ to $S_{1880}$ should be sequentially derived in advance by the first way described above. Or by using the second way described above, $S_{160}$ could be obtained by figuring out $B_{0,0}$ from the initial value of main data $S_0$ and then the calculation mechanism is provides to figure out $S_{160}, S_{332}, \ldots$ and $S_{1880}$ and thus $PO_0$ could be generated by vertically scrambling. Furthermore, for example left shifting the initial value $S_0$ 12 bytes (not limited) could figure out $B_{0,0}$.

In the present invention, DRAM accessing reduces. After reading main data from the host computer, main data (33024 (172×192) bytes) are written to DRAM. Next, main data (33024 bytes) are read from DRAM to generate the PO (2752 (172×16) bytes). Next, PO (2752 bytes) is written to DRAM. Next, main data (33024 bytes) and PO (2752 bytes) are read from DRAM to generate PI of main data (1920 (10×192) bytes) and PI (160 (10×16) bytes) of PO. Finally, the scrambled data due to generating PI with ID, IED, RSV, EDC, PO, and PI are recorded to the disc. Thus, total 104576 bytes are accessed between the drive IC and the DRAM.

Figure 7:
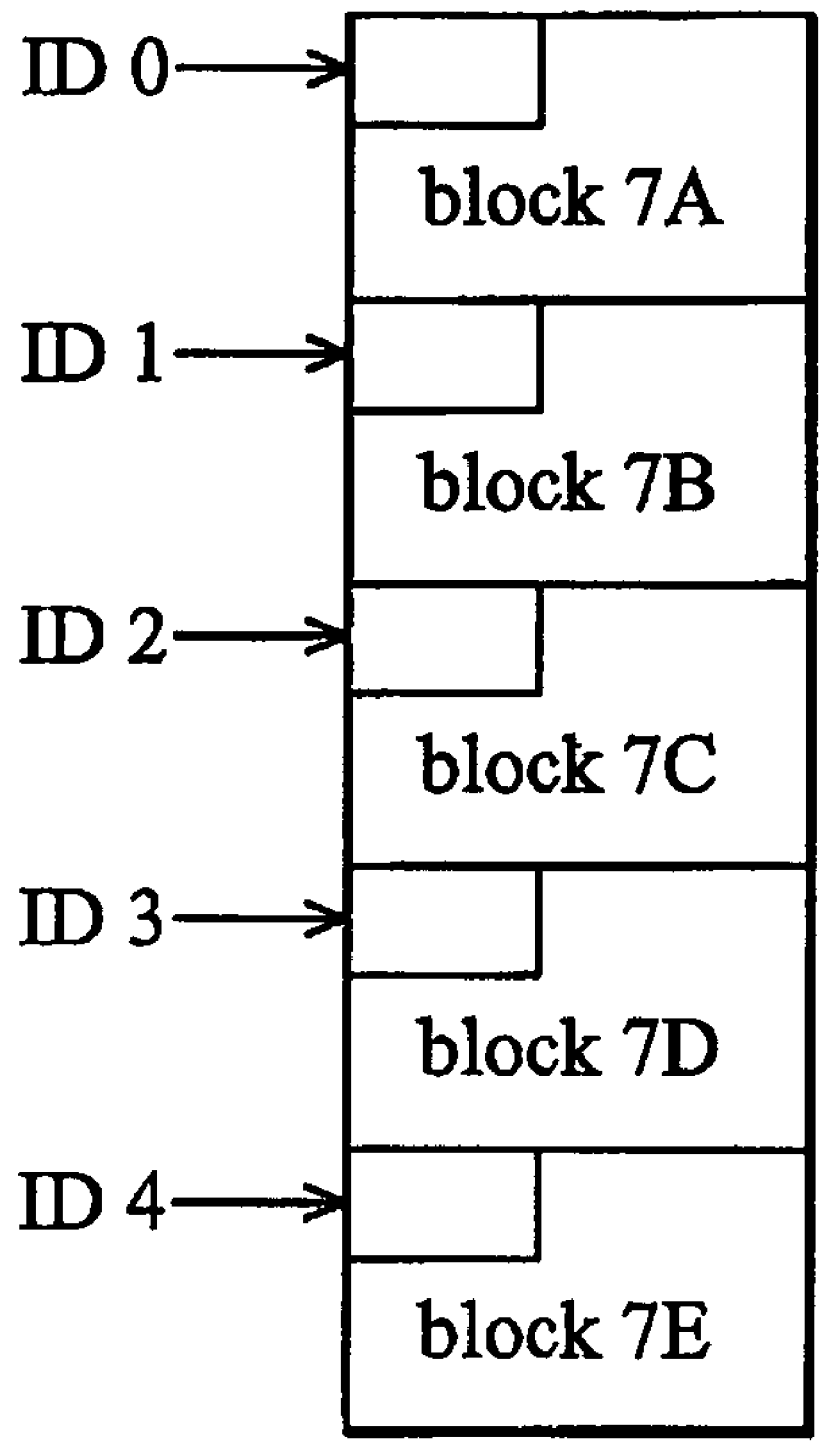
FIG. 7 shows an example of writing same data into different blocks.

FIG. 7 shows an example of 5 ECC blocks 7A~7E in a buffer as know, a common used method when recording data is: firstly, writing ID into each ECC blocks in orders; then writing data read from DRAM into each ECC blocks in orders (i.e. the first data with ID 0 is firstly written into the first block 7A, then the second data with ID 1 is then written into the second block 7B, and so no.). Hen a block is filled with data, the scrambling method of the invention described above is performed, and then the scrambled data with corresponding ID, IED, RSV, EDC, PI, and PO. are recorded onto a disc in sequence. It is noted that, writing data into blocks is simultaneous with recording data onto the disc, but under the same time, the writing block could be unequal to the recording block; that is to say, when data are continuously written into a block, the other blocks which have been encoded are recorded onto the disc at one time (i.e. assuming the writing block is 7C, so that the recording block could be 7A or 7B which is not limited). Furthermore after data with ID 4 is written into the last block 7E, the next data with ID 5 is written into the first block 7A and so on.

It is observed that, a commonly used method when writing the same data into different blocks is descrambling the scrambled data to original data, scrambling the original data as another scrambled data and then written into the desired block. Under the condition described above, memory bandwidth is wasted. As a result, the present invention provides a method when recording the same data onto different blocks. Because the data in the block is not scrambled data due to generating PO in the present invention (the scrambled data for generating PO is not stored in DRAM), so that if the same data is written into different blocks, the same data could be directly derived from DRAM without descrambling.

Taking FIG. 7 as an example, when blocks 7A~7E are filled data with ID 0~ID 4 in orders and some of them have been recorded onto the disc, then the next data with ID 5 would be written into block 7A, and if the data with ID 5 is same with the data with ID 3 (written in block 7D), thus because the data in block 7D is not scrambled data due to generating PO of the data with ID 3 (not stored in DRAM), so that the data could be directly derived from the DRAM and then scrambled again to generate PO of the data with ID 5. With comparing the common used method, in that condition, because the data in block 7D is scrambled data due to generating PO and PI of the data with ID 3, so that descrambling is firstly performed to the original data and then scrambling again as another scrambled data to be written into block 7A and to generate PO and PI of the data with ID 5.

Compared with conventional technology, less data is accessed between the drive IC and the DRAM. As mentioned above, the conventional technology accesses 176704 bytes between the drive IC and the DRAM to record a block to the disc. However, the optical recording method according to the present invention only accesses 104576 bytes between the drive IC and the DRAM to record a block to the disc, only 59.18% of that accessed in the conventional art, such that the recording speed of the optical disc is significantly increased.

The foregoing description of the invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method of scrambling data for generating parity codes of a data sector arranged in an array of a plurality of rows having data information and main data, wherein outer-code parity is superior to inner-code parity, comprising:
    scrambling a first ordering of the main data of the data sector in a first way, for generating outer-code parity; and
    scrambling a second ordering of the main data of the data sector in a second way, for generating inner-code parity.

2. The method as claimed in claim 1, wherein the main data scrambled in the first way does not replace the main data in a memory.

3. The method as claimed in claim 1, further comprising a step of deriving scrambling bytes from a known initial value by sequential calculating before scrambling.

4. The method as claimed in claim 3, wherein the initial value is the first scrambling byte of the main data, and a first scrambling byte of the second row is derived by sequential calculating from the initial value.

5. The method as claimed in claim 1, wherein after generating the inner-code parity, the data sector with the data information, the scrambled data due to generating inner-code parity, the inner-code parity, and the outer-code parity are recorded onto an optical disk.

6. The method as claimed in claim 1, wherein the data information comprises ID (Identification Data), IED (ID Error Detection Code), RSV (Reverse), and EDC (Error Detection Code).

7. The method as claimed in claim 1, further comprising a step of deriving scrambling bytes from a known initial value.

8. The method as claimed in claim 7, wherein the initial value is the first scrambling byte of the main data, and a first scrambling byte of the second row is derived by left shifting the initial value a plurality of bytes.

9. A method for generating a recording data of an optical disk, wherein outer-code parity is superior to inner-code parity, comprising:
    receiving a plurality of data sectors having data information and main data and arranged in an array of a plurality of rows;
    scrambling a first ordering of the main data of each corresponding data sector in a first way and generating therefrom corresponding outer-code parity of each data sector;
    scrambling a second ordering of the main data of each corresponding data sector in a second way and generating therefrom, and from outer-code parity, corresponding inner-code parity of each data sector; and
    recording the main data scrambled in the second way, the data information, the inner-code parity, and the outer-code parity onto the optical disk.

10. The method as claimed in claim 9, wherein the inner-code parity is attached to the corresponding main data row and attached to the corresponding outer-code parity.

11. The method as claimed in claim 9, further comprising a step of interleaving the outer-code parity to each corresponding data sector.

12. The method as claimed in claim 9, wherein the main data scrambled in the first way does not replace the main data in a memory.

13. The method as claimed in claim 9, wherein the data information comprises ID (Identification Data), IED (ID Error Detection Code), RSV (Reverse), and EDC (Error Detection Code).

14. The method as claimed in claim 9, wherein the optical disk is a DVD–R, a DVD+R, a DVD–RW, a DVD+RW, or a DVD–RAM.

15. The method as claimed in claim 9, further comprising a step of deriving scrambling bytes from a known initial value by sequential calculating before scrambling.

16. The method as claimed in claim 15, wherein the initial value is the first scrambling byte of the main data, and a first scrambling byte of the second row is derived by sequential calculating from the initial value.

17. The method as claimed in claim 9, further comprising a step of deriving scrambling bytes from a known initial value.

18. The method as claimed in claim 17, wherein the initial value is the first scrambling byte of the main data, and a first scrambling byte of the second row is derived by left shifting the initial value a plurality of bytes.

19. A method of repeatedly reading main data stored in a memory, and recording an optical disk, comprising:
    scrambling in a first way the main data directly as read from the memory in a first ordering and generating outer-code parity therefrom, wherein the main data remains unchanged in the memory;
    scrambling in a second way the main data directly as read from the memory in a first ordering and generating inner-code parity therefrom and from the outer-coded parity; and
    recording the main data scrambled in the second way, together with corresponding data information, the inner-code parity and the outer-code parity, onto the optical disk.

20. The method as claimed in claim 19, wherein the corresponding data information comprises ID (Identification Data), IED (ID Error Detection Code), RSV (Reverse), and EDC (Error Detection Code).

21. The method as claimed in claim 19, wherein the ID is generated according to a block position of recording the main data.

22. The method as claimed in claim 19, wherein the outer-code parity is superior to the inner-code parity.

23. The method as claimed in claim 19 wherein the optical disk is a DVD–R, a DVD+R, a DVD–RW, a DVD+RW, or a DVD–RAM.

24. The method as claimed in claim 19, further comprising a step of deriving scrambling bytes from a known initial value by sequential calculating before scrambling.

25. The method as claimed in claim 24, wherein the initial value is the first scrambling byte of the main data, and a first scrambling byte of the second row is derived by sequential calculating from the initial value.

26. The method as claimed in claim 19, further comprising a step of deriving scrambling bytes from a known initial value.

27. The method as claimed in claim 26, wherein the initial value is the first scrambling byte of the main data, and a first scrambling byte of the second row is derived by left shifting the initial value a plurality of bytes.

* * * * *